(12) United States Patent
Lake

(10) Patent No.: US 7,927,916 B2
(45) Date of Patent: Apr. 19, 2011

(54) OPTIC WAFER WITH RELIEFS, WAFER ASSEMBLY INCLUDING SAME AND METHODS OF DICING WAFER ASSEMBLY

(75) Inventor: Rickie C. Lake, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 123 days.

(21) Appl. No.: 11/732,691

(22) Filed: Apr. 4, 2007

(65) Prior Publication Data
US 2008/0246066 A1    Oct. 9, 2008

(51) Int. Cl.
*H01L 21/44* (2006.01)
(52) U.S. Cl. ........................ 438/106; 438/462
(58) Field of Classification Search .......... 438/106–127, 438/68, 459–465
See application file for complete search history.

(56) References Cited

U.S. PATENT DOCUMENTS

| | | | |
|---|---|---|---|
| 5,516,728 A * | 5/1996 | Degani et al. | 438/465 |
| 6,586,831 B2 * | 7/2003 | Gooch et al. | 257/704 |
| 6,641,381 B2 | 11/2003 | Ball | |
| 6,830,990 B1 | 12/2004 | Honer et al. | |
| 6,955,989 B2 | 10/2005 | Perregaux et al. | |
| 7,001,797 B2 * | 2/2006 | Hashimoto | 438/113 |
| 7,026,189 B2 * | 4/2006 | Chen et al. | 438/113 |
| 7,045,370 B2 | 5/2006 | Crafts et al. | |
| 2006/0110856 A1 | 5/2006 | Chen et al. | |
| 2006/0125084 A1 * | 6/2006 | Fazzio et al. | 257/704 |
| 2006/0166463 A1 * | 7/2006 | Bakke et al. | 438/459 |
| 2006/0189100 A1 | 8/2006 | Ishizuka | |
| 2006/0281227 A1 * | 12/2006 | Yang | 438/118 |
| 2008/0164612 A1 * | 7/2008 | Zhuo | 257/746 |

* cited by examiner

*Primary Examiner* — Savitri Mulpuri
(74) *Attorney, Agent, or Firm* — TraskBritt

(57) ABSTRACT

An optic wafer for assembly with an imager wafer, the optic wafer comprising a plurality of reliefs in a surface thereof coincident with street locations separating mutually adjacent optic element locations. A wafer assembly that includes the optic wafer and an imager wafer and methods of dicing a wafer assembly are also disclosed.

14 Claims, 4 Drawing Sheets

OPTIC WAFER WITH RELIEFS, WAFER ASSEMBLY INCLUDING SAME AND METHODS OF DICING WAFER ASSEMBLY

FIELD OF THE INVENTION

The invention relates generally to optic wafers used for fabricating semiconductor imaging device packages at the wafer level and, more particularly, to an optic wafer including reliefs in a major surface thereof, a wafer assembly including such an optic wafer and methods of dicing the wafer assembly.

BACKGROUND OF RELATED ART

Complementary metal-oxide-semiconductor (CMOS) imagers are conventionally fabricated by manufacturing a so-called imager wafer comprising an array of semiconductor imager devices each having an optically sensitive region thereon, that are mutually separated by boundary areas in the form of so-called "streets" along which dicing or singulating of the semiconductor devices may be effected by cutting.

A wafer assembly containing an array of the semiconductor imager devices is formed by aligning an optic wafer and an imager wafer and then securing the optic wafer and the imager wafer together. The optic wafer may comprise a wafer of glass or other transparent material, or may comprise a wafer level lens array comprising a plurality of lenses in a carrier substrate. In either case, optically transmissive regions of the optic wafer corresponding to locations of semiconductor imager devices on an imager wafer are separated by streets corresponding to street locations on the imager wafer. The optic wafer and the imager wafer are secured together by bonding the imager wafer and optic wafer together along the complementary streets with an adhesive such as epoxy, for example. The adhesive provides a bond thickness sufficient to facilitate singulation of the wafer assembly, as hereinafter described. While singulation of the wafer assembly may be further enhanced by increasing the bond thickness of the adhesive, the planarity of the wafer assembly may be compromised by such an increased bond thickness. It would be desirable to provide an assembly and singulation technique to maintain or improve the planarity of the wafer assembly while accommodating the known limitations of conventional equipment used to singulate or dice the wafer assembly.

In order to preserve the quality and integrity of the wafer assembly and the imager packages singulated therefrom during singulation, precision cutting along the streets to determinant depths with rotating saw blades, for example, is required. Otherwise, dicing of a particular layer of the wafer assembly may not be completed when a saw blade undercuts the wafer assembly, while damage may occur when a saw blade overcuts through a layer of the wafer assembly and into another layer. While undercutting requires reworking of the wafer assembly and undesirably results in lost productivity in order to complete the dicing process, overcutting results in a loss of, or damage to, the imager packages being singulated and may also cause damage to the cutting edge of a saw blade, resulting in lost time, product yield and money.

A conventional method of dicing a wafer assembly 20 comprising an optic wafer and an imager wafer, as noted above, requires utilization of an adhesive layer 26 to interface with the cutting edge of the saw blade in order to avoid damage to the wafer assembly 20 as shown in FIG. 1 during the singulation process. A rotating saw blade 30, provided on its cutting edge with a material suitable for cutting a semiconductor material, such as silicon, of an imager wafer and having a suitably shaped cutting edge, is shown cutting through an imager wafer 22 along a street 28 of the wafer assembly 20 and into the adhesive layer 26. In order to make a complete cut through the imager wafer 22 without causing damage to the rotating saw blade 30, the rotating saw blade 30 must penetrate through the semiconductor material of the imager wafer 22 and into, but not through, the adhesive layer 26. The thickness of adhesive layer 26 is on the order of 80 microns, having a normal variance of about plus or minus 10 microns, which may lead to undesirable penetration of the saw blade 30 into the material of optic wafer 24 during the dicing operation due to tolerance buildup of the various superimposed layers (imager wafer 22, adhesive layer 26, optic wafer 24) within the wafer assembly 20 or lack of adequate cutting depth tolerance accuracy of the saw blade 30. Should the saw blade 30 contact the material of the optic wafer 24, the saw blade 30 will break and also cause damage to at least portions of the wafer assembly 20.

After cutting of the imager wafer 22 is completed, another rotating saw blade 32, having a cutting edge configured with a material suitable for cutting a material of an optic wafer such as a glass (silicon dioxide, borosilicate glass, phosphosilicate glass, borophosphosilicate glass, polyimides, photopolymers, etc.) is shown at the right-hand side of FIG. 2 cutting through the optic wafer 24 along a street 29 of the wafer assembly 20 and into the adhesive layer 26 to finish the singulation process along street 29, where a cut through imager wafer 22 has already been effected. In order to complete dicing along a given street without damage, the cut made by the saw blade 32 must penetrate through the optic wafer 24 and into the adhesive layer 26 without contacting the imager wafer 22. As an example of an undesirable result, the saw blade 32 is shown cutting the street 28 beyond an acceptable depth criterion through and into the imager wafer 22 as shown by reference numeral 34 at the left-hand side of FIG. 2, potentially damaging one or more of the singulated semiconductor imager devices 36. It would be desirable to provide a wafer assembly that is capable of singulation without being affected by nominal variance in the adhesive layer, tolerance buildup or saw blade tolerance variations.

Accordingly, there is an ongoing desire to improve planarity of a multi-layer wafer assembly, such as an imager wafer assembly, without compromising the singulation process. There is a further desire to provide a multi-layer wafer assembly that is unaffected during singulation by nominal variances in thickness of the various layers of the assembly. There is also a desire to provide an optic wafer that accommodates the tolerance variations of the wafer assembly layers and equipment tolerances in order to improve the quality and resultant yield of the singulation process.

DETAILED DESCRIPTION OF THE INVENTION

In order to minimize the sensitivities to damage associated with the tolerance build up of the adhesive layer and other components when dicing a wafer assembly, in some embodiments a preconfigured optic wafer is provided for assembly with a semiconductor component in the form of an imager wafer. The optic wafer comprises a carrier substrate structure having a plurality of streets separating mutually adjacent optical elements, and reliefs within the streets formed in a first surface of the structure. The reliefs provide a vertical and a horizontal process margin for dicing. Other embodiments of the invention include a wafer assembly comprising a preconfigured optic wafer including reliefs and an imager wafer. Further embodiments of the invention comprise methods of singulating a wafer assembly. The various drawings depict embodiments of the invention as will be understood by the use of ordinary skill in the art and are not necessarily drawn to scale. The terms "dicing" and "singulation" as used herein are broad and are not limited in scope or meaning to any particular technique known to those of ordinary skill in the art. Generally the term "singulation" as used herein, for example and without limitation, refers to the act of obtaining subcomponents from a principal component, i.e., a workpiece in the form of a wafer or other bulk substrate or a multi-layer assembly of superimposed wafers or substrates, and the term "dicing" refers to the physical action used to separate a principal component into subcomponents such as semiconductor dice. As another example, the terms "diced" and "singulated" may have overlap in their meaning as used herein, such as in the case when a subcomponent may have been diced or singulated from a principal component.

In addition, while the term "wafer" has been employed throughout the application in the context of "optic wafer," "imager wafer" and "wafer assembly," the term "wafer" includes and encompasses other bulk substrates of other than substantially circular shape on which an array of semiconductor devices or optic elements may be fabricated. For example, the term "wafer" includes, by way of nonlimiting example in the context of semiconductor device fabrication, silicon-on-insulator (SOI) substrates such as silicon-on-glass (SOG) substrates, and other substrates comprising a layer of semiconductor material on a carrier substrate. Similarly, optic wafers may comprise a quartz or glass substrate, or a grid-like carrier substrate bearing quartz, glass, polymer, or other optic elements including, without limitation, lenses, cover glasses, filters, etc.

Without limitation, the terms used in describing the various embodiments of the invention may be interchanged with like terms known and used by those having ordinary skill in the art.

Figure 1:
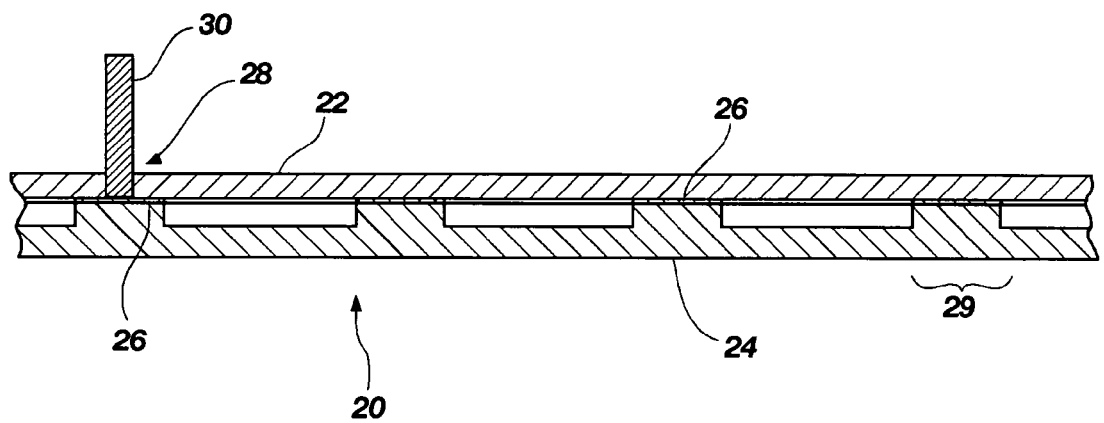
FIG. 1 shows a partial cross sectional view of a conventional multi-layer wafer assembly being diced during a singulation process.
Figure 2:
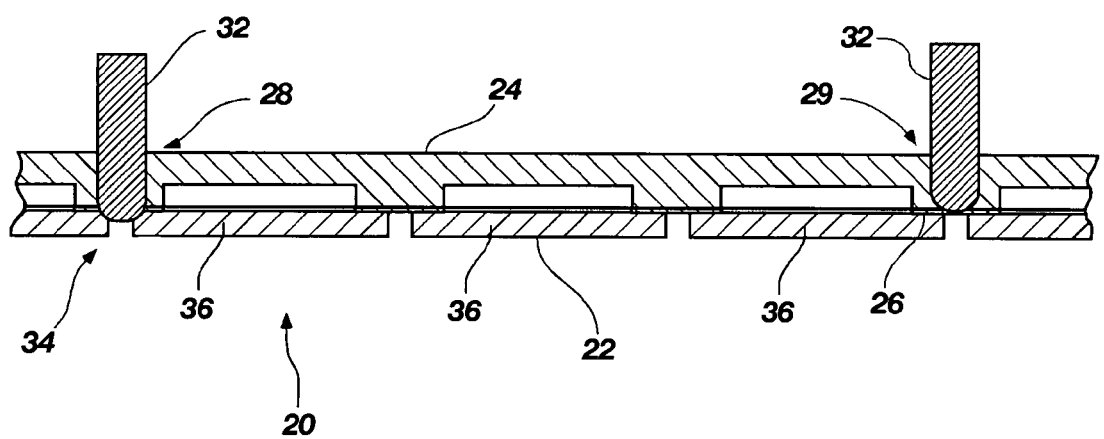
FIG. 2 shows a cross sectional view of the conventional multi-layer wafer assembly of FIG. 1 being diced during the singulation process.
Figure 3:
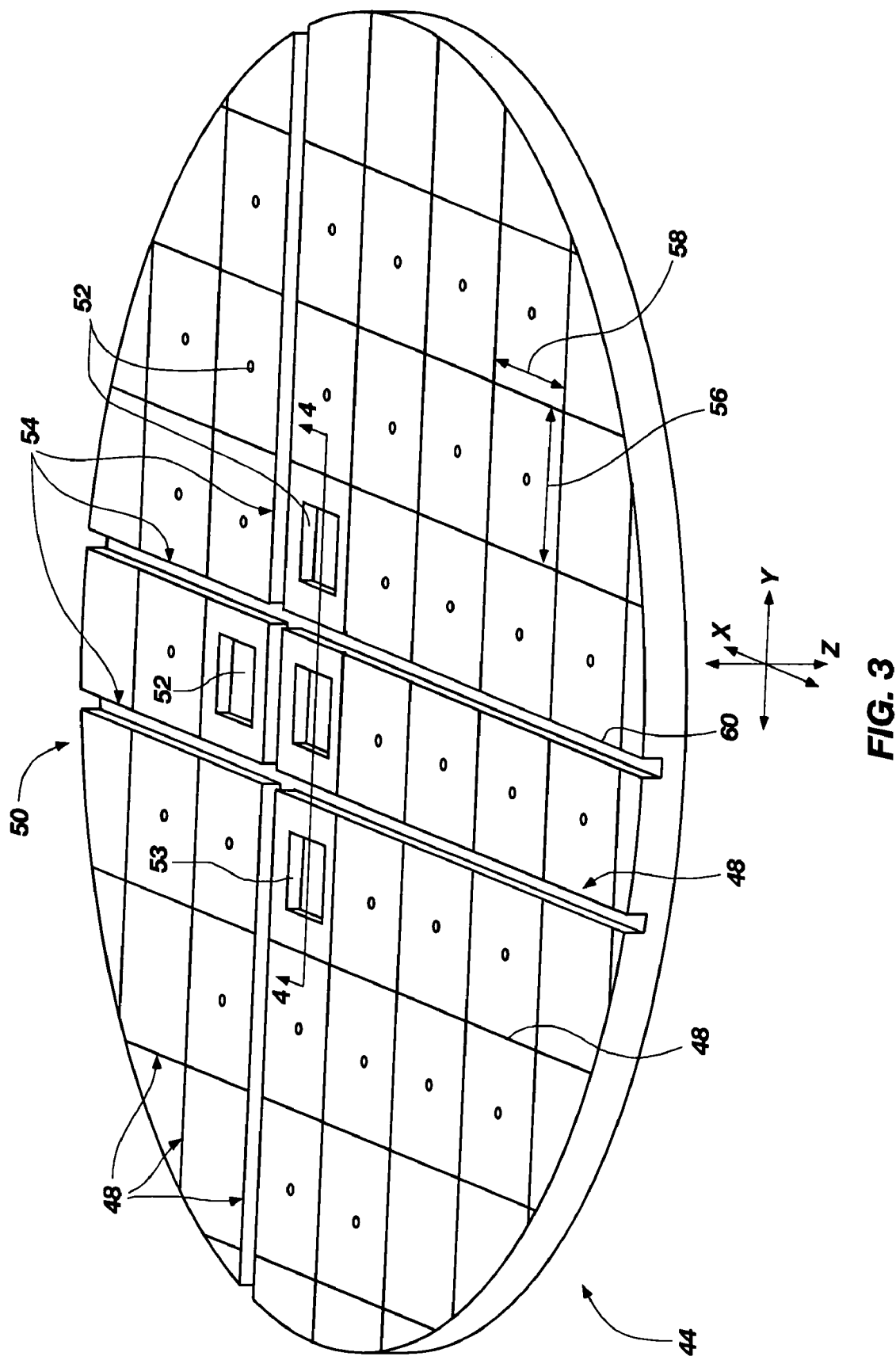
FIG. 3 shows a perspective view of an optic wafer in accordance with an embodiment of the invention.
Figure 4:
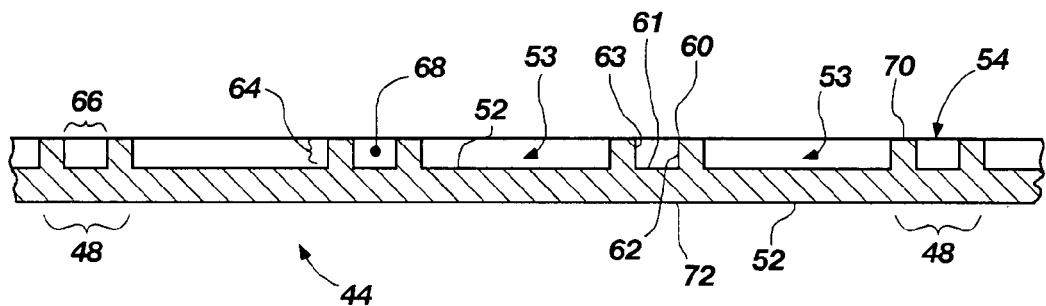
FIG. 4 shows a cross sectional view of the optic wafer shown in FIG. 3.

FIG. 3 shows a perspective view of an optic wafer 44 in accordance with an embodiment of the invention. Reference may also be made to FIG. 4, which shows a partial cross sectional view of the optic wafer 44. The optic wafer 44, in this embodiment of the invention, may be formed from a unitary optically transmissive material such as quartz, for example and without limitation, and includes an array of optic elements 52 each circumscribed by a plurality of mutually perpendicular streets 48 having reliefs 54 (only three shown for clarity) formed therealong. Optic elements 52 in the form of lenses or cover glass elements and reliefs 54 may be formed in optic wafer 44 by a patterning and etching process, which may include dry (reactive ion etching, or RIE) etching and wet (chemical) etching processes as is known by the use of one of skill in the art. Each relief 54 facilitates singulation of the optic wafer 44 (including any wafer assembly including the optic wafer 44) during dicing along the streets 48 as described below. While the optic wafer 44 is fabricated in this embodiment by etching a material to obtain the desired structure an optic wafer may be suitably formed by cutting, milling and polishing the wafer material or by any other manufacturing process known to person having ordinary skill in the art including molding, for example and without limitation.

As another optic wafer structure approach, an optic wafer may be fabricated by providing a grid-like carrier substrate including an array of apertures formed therein, the runners of the grid corresponding to desired street locations, each runner having a relief formed therein, and the apertures having lenses formed therein or thereover of a glass or a polymer. The carrier substrate may be formed, for example, of borosilicate glass.

In order to provide an efficient pattern for singulating the array of optic elements 52 from the optic wafer 44, the streets 48 are aligned rectilinearly about each optic element 52 in order to form a rectilinear grid 50 having an x-axis and a y-axis lying in the plane of the optic wafer 44. The streets 48 running substantially parallel with the y-axis are spaced apart at a first increment 56, and the streets 48 running substantially parallel with the x-axis are spaced apart at a second increment 58 allowing each optic element 52 to reside within a rectilinear area formed by the intersecting streets 48. Each street 48 provides sufficient space between each optic element 52 to allow select removal of the material of the optic wafer 44 during the dicing process with, for example, a rotating saw blade without affecting or damaging the optic elements 52. While the grid 50 of the current embodiment is rectilinear and defines rectangular optic elements 52, it may also be configured to define square optic elements, in order to conform dimensionally to any designed size and shape of an optic element corresponding to the size and shape of a semiconductor imager device to be employed therewith.

Each relief 54 resides substantially along and within the boundaries created by the streets 48. Each relief 54 in this embodiment of the invention is formed in the shape of an open channel 60 that includes a floor 61 and two opposing side walls 62, 63. As illustrated in FIG. 4, channel 60 may be of rectangular cross section. The open channel 60 provides a depth margin 64 and a width margin 66 for dicing during a singulation process. The depth margin 64 may be described, with respect to operation of a cutting element 80 used to singulate imager wafer 42 as described with respect to FIG. 5, as the distance between the floor 61, of the channel 60, and a reference position 68. The reference position 68 represents the intended depth and horizontal position of a cutting path taken by a cutting element (not shown) such as a saw blade during the dicing process. The depth margin 64 may also be thought of as the distance between a top surface 70 of the optic wafer 44 containing the open channel 60 and the reference position 68. The depth margin 64 may be designed to accommodate tolerance buildup resulting from deviations in manufacturing tolerance of the various layers of the optic wafer 44, and may further be designed to accommodate the presence of any material layers that may add to tolerance buildup as well as tolerance variations in depth of cut of the cutting element, ensuring that the actual depth of cut of the cutting element will necessarily reside within the depth margin during the dicing process without concern for the variability of any given material layer.

The width margin 66 may be determined, again with respect to use of cutting element 80, as the distance between either or both side walls 62, 63 and the reference position 68. The width margin may also be determined as the distance between side walls, less a thickness of a blade of the cutting element. By providing respective reliefs 54 of sufficient width within the streets 48 of the optic wafer 44, a process margin is provided to mitigate tolerance variations in the lateral alignment of the cutting element blade with respect to the position of each street 48, including indexing error caused by aligning the cutting element blade with respect to each street 48 as the cutting element is sequentially moved across a wafer assembly from street to street.

Each optic element 52 is formed to enable transmission of electromagnetic radiation therethrough. The electromagnetic radiation may include visible and nonvisible (i.e., infrared, ultraviolet) wavelengths of the electromagnetic spectrum for example and without limitation. Each optic element 52 may be configured as, by way of nonlimiting example, a cover glass, a single lens of any desired configuration or a plurality of lenses suitable for transmitting and, optionally, focusing or alternatively collimating electromagnetic radiation in a desired way. Each optic element 52 may also be formed so as to comprise a filter in order to selectively allow electromagnetic radiation of various wavelengths to pass therethrough. Further, each optic element 52, as shown in the illustrated embodiment, includes a cavity 53 formed (only four cavities 53 shown, for clarity, in FIG. 3), in this embodiment of the invention, during the process used to make the glass wafer and form reliefs 54. Each cavity 53 may provide an air, gas or vacuum gap between the optic element 52 and a semiconductor imager device 41 over which optic element 52 is superimposed. Optionally, a cavity may also be provided above each optic element 52 on an outer surface 72 of the optic wafer 44 suited for other applications, including superimposition of another wafer with another lens, cover glass, etc.

Figure 5:
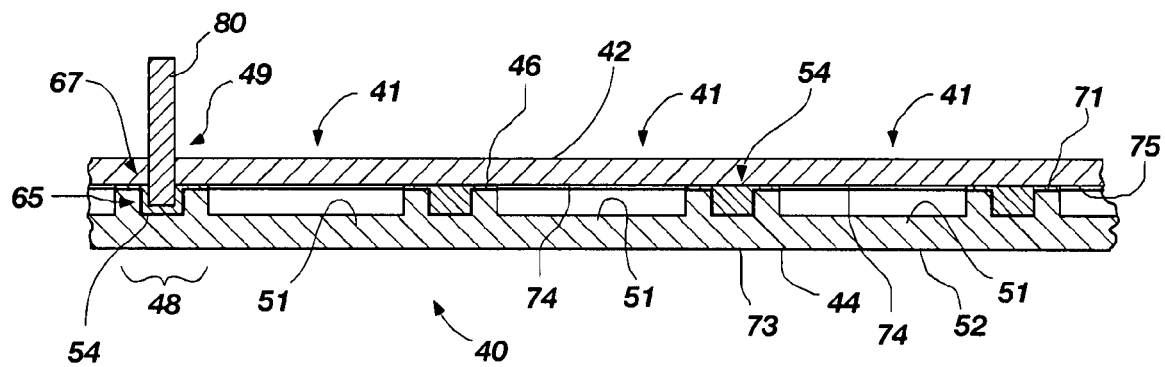
FIG. 5 shows a cross sectional view of a multi-layer wafer assembly in accordance with another embodiment of the invention in the process of being singulated according to an embodiment of a method of the invention.

FIG. 5 shows a partial cross sectional view of a wafer assembly 40 in accordance with another embodiment of the invention, shown being diced during a singulation process. The wafer assembly 40 includes one or more semiconductor imager devices 41 formed on imager wafer 42. The semiconductor imager devices 41 are representatively shown without detail. The wafer assembly 40 includes an optic wafer 44 coupled by a bond layer 46 to an imager wafer 42. The optic wafer 44 in this embodiment of the invention is formed from an optic material such as quartz, for example, without limitation, and includes an array of optic elements 52 delineated by streets 48 that each include a relief 54. Each optic element 52 in this embodiment includes a single lens 51 for directing incident electromagnetic radiation upon an optically sensitive region, such as an imager (pixel) array, formed on a semiconductor imager device of the imager wafer 42. The lens 51 (specific configuration not shown) of each optic element 52 is formed in alignment with a cavity 53 on the device wafer side 71 of the optic wafer 44. The lens 51 may be configured on a portion of the inner surface of the cavity, on the outer surface 73 of the optic wafer 44, or comprise both such surfaces, for example and without limitation. Optionally, each optic element 52 may comprise more than one lens for selectively directing incident electromagnetic radiation onto a semiconductor imager device 41 of the imager wafer 42.

The cavity 53 provides an effective clearance, or standoff, between each lens 51 of an optic element 52 and an associated device element 74, i.e., microlenses or other elements superimposed over pixels of an imaging array, residing on or in proximity to a surface 75 of a semiconductor imager device 41 of the imager wafer 42 facing optic wafer 44. As noted previously, optic wafer 44 may also include other cavities (not shown) formed in the outer surface 73 of the optic wafer 44.

The imager wafer 42 includes the array of semiconductor imager devices 41, each separated by streets 49 complementing the streets 48 of the optic wafer 44 to which it is selectively affixed. The optic wafer 44, the imager wafer 42, or both, may have applied thereto an adhesive substantially within the streets 48 and 49, respectively, for forming a bond layer 46 therebetween when the optic wafer 44 and the imager wafer 42 are superimposed and coupled together in mutual alignment. The adhesive used to form the bond layer 46 may include liquid adhesives, dry adhesives and double sided adhesive film or tape, for example and without limitation. It is also contemplated that a conventional adhesive may not be employed and that another bonding technique, such as anodic bonding or fusion bonding may be employed to secure optic wafer 44 to imager wafer 42.

The reliefs 54 provide a process margin for safely receiving a cutting element 80 therein without contact with optic wafer 44 during dicing of imager wafer 42 irrespective of tolerance buildup, the thickness of the bond layer 46 or vertical and horizontal positional variations of the cutting element 80 within conventional tolerances.

As shown in FIG. 5, the reliefs 54 provide for an enhanced method for singulating each of the semiconductor imager devices 41 and their respectively associated optic elements 52 from the wafer assembly 40. A rotating blade of cutting element 80, having a suitably configured cutting edge bearing a material suitable for cutting the semiconductor material of the imager wafer 42, is shown cutting through the imager wafer 42 along a street 49 of the wafer assembly 40 and into an associated relief 54 thereunder containing adhesive comprising bond layer 46. Each relief 54 provides a depth margin 65 for allowing the blade 80 to safely penetrate entirely through the imager wafer 42 irrespective of the thickness of the bond layer 46, and variations therein. The depth margin 65 provides a selected degree of protection for keeping the blade 80 from coming into contact with the underlying optic wafer 44 and consequently minimizes the risk of damaging the blade 80 due to such contact. In order to further protect the blade 80 from coming into damaging contact with the optic wafer 44, each relief 54 provides a width margin 67 that also allows the blade 80 to safely penetrate entirely through the imager wafer 42 along its associated street 48 of the wafer assembly 40. The greater the depths or the widths of the reliefs 54, the greater the depth margin 65 and the width margin 67, respectively, is for avoiding damaging contact between the blade 80 and material of optic wafer 44 of the wafer assembly 40.

For example, without limitation, the wafer assembly 40 in this embodiment has a thickness of about 710 microns with a thickness variance, or tolerance buildup, of about 10 to 20 microns substantially caused by the thickness variations in bond layer 46 and minor topographic variations in imager wafer 42 and optic wafer 44. The individual thicknesses of the imager wafer 42, the bond layer 46 and the optic wafer 44 are about 130, 80 and 500 microns, respectively. Each relief 54 in this embodiment has a width of about 160 microns and a depth of about 100 microns. The depth margin 65 may be determined by taking the minimum and the maximum vertical distances between the surface of the imager wafer 42 facing optic wafer 44 and the floor 61 of the relief 54, less the thickness of the bond layer 46. In the current embodiment, the depth margin 65 provides (assuming worst case variance of 20 microns) 60 microns of protective vertical clearance where the cutting element 80 is configured to cut at least 230 micron deep to ensure complete cutting of the device wafer 42 and bond layer 46. The depth margin 65 of 60 microns in this embodiment provides significant process margin and assurance that the cutting element 80 will not contact and be damaged by the optic wafer 44. Furthermore, the cutting element 80 configured for cutting the imager wafer 42 is on the order of 50 to 60 microns in thickness, which affords a width margin 67 of about 50 microns on each side of a centered position for cutting element 80 within a relief 54, which facilitates a degree of process margin while cutting along the streets 49.

In embodiments of the invention, the depth margin may accommodate the maximum thickness of a bond layer in a wafer assembly due to tolerance buildup while providing assurance of complete dicing of an imager wafer due to the minimum thickness of the bond layer without concern of overcutting into an optic wafer. In embodiments of the invention, the width margin may accommodate some misalignment of the streets of different layers in a wafer assembly, the alignment error of a cutting element with respect to the wafer, or nonuniform blade width or cavitation of a rotating saw blade or other cutting element.

Figure 6:
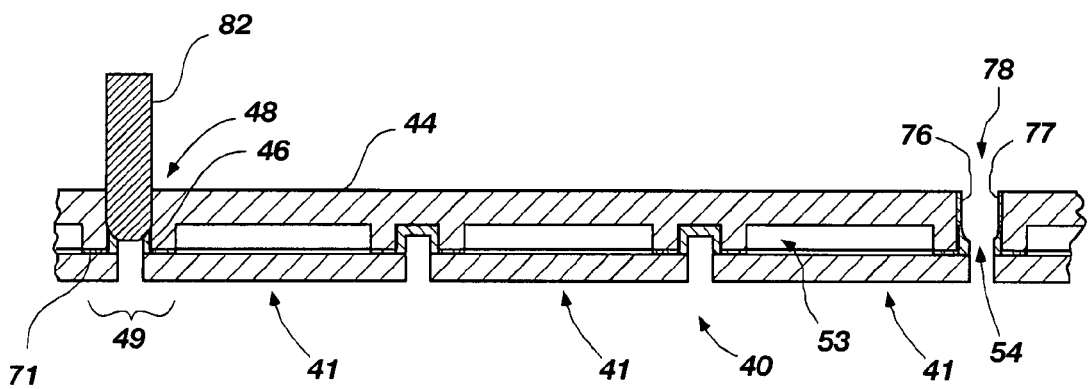
FIG. 6 shows a cross sectional view of the multi-layer wafer assembly of FIG. 5 being singulated according to an embodiment of a method of the invention.

After dicing of the imager wafer 42 is completed, a second cutting element 82, in the form, for example, of a rotating blade having a cutting edge of a material suitable for cutting the material comprising the streets 48 of optic wafer 44, is shown in FIG. 6 cutting through the optic wafer 44 along a street 48 and into the associated relief 54 to finish singulating the wafer assembly 40. The relief 54 provides process margin, i.e., width margin and depth margin, for the rotating blade of second cutting element 82 in order to avoid damaging contact with the semiconductor devices 41 being diced from the wafer assembly 40. Moreover, the depth margin may confine the cutting element 82 to within a boundary, created by the device wafer side 71 of the optic wafer 44 substantially containing the relief 54 therein, in order to provide an additional measure of assurance during dicing. The blade of cutting element 82 may be thinner or wider than the width of the relief 54 as shown.

For example, without limitation, the wafer assembly 40 in the example above provides a depth margin of 60 microns (assuming worse case variance of 20 microns in the layers of the wafer assembly 40 as assumed in the above example) of protection where the cutting element 82 is positioned to cut at least 440 microns deep into the 500 micron thick optic wafer 44 to ensure complete cutting thereof. The depth margin of 60 microns in this embodiment provides significant process margin and assurance that the cutting element 82 will not come into damaging contact with the imager wafer 42 as the depth of cut of cutting element 82 is contained within the relief 54 during dicing. Furthermore, the cutting element 82, configured for cutting the optic wafer 44, is on the order of 160 microns in thickness, which is equal to the width of the relief 54 in this embodiment, but the thickness of the opposing lateral walls of optic wafer 42, defining each relief 54, provide an adequate width margin should cutting element 82 be off-alignment, within tolerance. Where the thickness of the cutting element 82 is less than the width of the relief 54, the cutting element may be advantageously used to coat the sides of the diced portions of imager wafer 42 as discussed below.

Optionally, as shown in FIG. 5 and FIG. 6, the adhesive, such as an epoxy, used to form the bond layer 46 may also be introduced into the relief 54. Advantageously, the adhesive may include an opaque or other nonreflective quality for preventing transient electromagnetic radiation from passing therethrough and reflecting therefrom by allowing the adhesive to be used for shielding portions of the optic wafer 44 when diced. For example, while singulating the optic wafer 44 as shown in FIG. 6, a blade (not shown) may be used to distribute, as depicted at the right-hand side of FIG. 6, the adhesive onto the sides 76, 77 of the cut slot cut into the portion of the optic wafer 44 aligned with relief 54 in order that a coated layer 78 of adhesive remains on each side 76, 77 as the cutting element 82 retreats therefrom.

Optionally, the side walls of the cavities 53 of the optic wafer 44 may also be coated or pretreated with a selected material prior to bonding with the imager wafer 42 in order to render it opaque for shielding, controlling or minimizing electromagnetic radiation diffusion or reflection onto the surface of semiconductor imager device 41 proximate to which its imaging array resides. Alternatively, the side walls of the reliefs may be so treated. One suitable, nonlimiting treatment is electroless plating of a metal, wherein a seed layer is first deposited on the surfaces to be plated. Electroplating is a technique well known to those of ordinary skill in the art, and so further description thereof is unnecessary.

Figure 7:
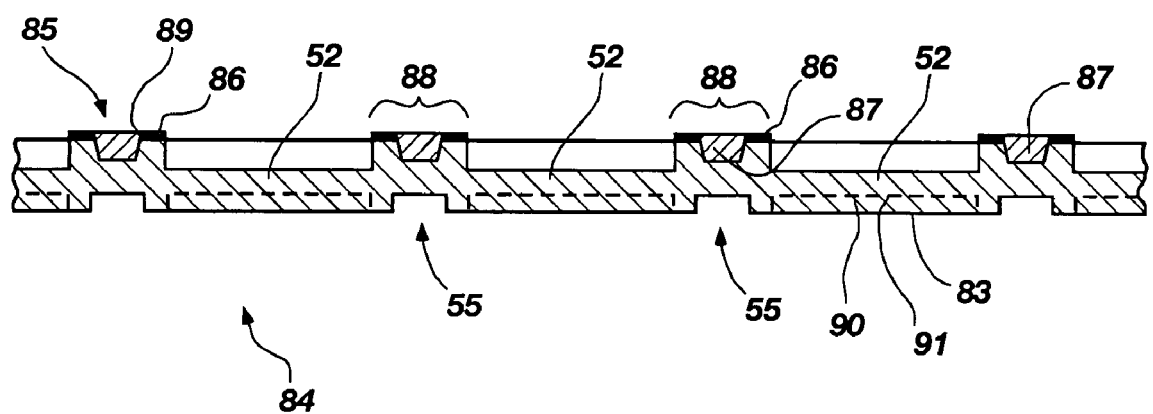
FIG. 7 shows a cross sectional view of an optic wafer in accordance with yet another embodiment of the invention.

FIG. 7 shows a partial cross sectional view of an optic wafer 84 in accordance with yet another embodiment of the invention. The optic wafer 84 includes a plurality of streets 88 each having a relief 85 substantially formed therein to facilitate dicing of an imaging wafer on which optic wafer 84 is superimposed in the manner previously described. Each relief 85 comprises a channel 89 that is trapezoidal in cross-sectional shape, by way of nonlimiting example. The channel 89 may have any other cross sectional shape as would be known by those of ordinary skill in the art.

The optic wafer 84 further includes in this embodiment a plurality of second reliefs 55 located substantially within the streets 88 and on the outer surface 83. The second reliefs 55 may allow faster dicing of the optic wafer 84 and may allow a cutting element to dice the optic wafer 84 without coming into direct and damaging contact with the outer surface 83 of the optic wafer 84 in the vicinity of its optic elements 52. The second reliefs 55 of the outer surface 83 may also provide a process margin for cutting when coupled to another superimposed structure where tolerance buildup may cause potential damage during the singulation process as described herein.

Also, the optic wafer 84, as depicted in FIG. 7, may include a bond layer 86 and a soluble filler 87 in each relief 85. The soluble filler 87 is a material that may be used to partially secure the optic wafer 84 together with an imager wafer during subsequent processing like dicing, for example, because the depth and width margins 65, 67 as described above allows the soluble filler 87 to span the width of the relief 85 after dicing. The soluble filler 87 may be made from a water- or other solvent-soluble material known to a person having skill in the art. When the optic wafer 84 is bonded to an imager wafer and then the wafer assembly is diced as described herein, the soluble filler 87 may be dissolved to finish die singulation without requiring complete penetration of a cutting element into the relief 54 to singulate either the imager wafer or the optic wafer 84. The soluble filler 87, notably, provides an additional margin equal to the thickness of the bond layer 86 for singulation of the imager wafer.

Optionally, in embodiments of the invention, a cavity 90 may be provided in the optic wafer 84, as illustrated in FIG. 7. Also, the cavity 90 may be used to house one or more of a lens, a filter, a cover glass, as denoted by reference numeral 91 within the cavity 90.

To facilitate dicing of a wafer assembly as described herein, the wafer assembly may be provided into a system suitable for dicing or otherwise singulating the wafer assembly by configuring or adjusting the system in terms of cutting element position, thickness, etc. to optimally utilize the process margin provided for the side of the wafer assembly being cut.

In order to further facilitate dicing of a wafer assembly having one or more partially fabricated semiconductor devices as described herein, the wafer assembly may be placed upon a carrier or removably fixed to a carrier film or sheet coating with, for example, a UV-sensitive adhesive, as understood and practiced by those of ordinary skill in the art. To further facilitate bi-directional and two sided dicing as may be utilized in embodiments of the invention, an adhesive sheet may be applied to one or both sides of the wafer assembly, i.e., to an imager wafer side and to an optic wafer side, during the singulation process in order to retain portions of the wafer assembly until singulation of the wafer assembly is completed and, thereafter, removing the adhesive sheets.

Each street, as described in the embodiments of the invention, represent a demarcation of a portion of an optic wafer, an imager wafer or a wafer assembly suitable for cutting, dicing, separating, slicing or scribing without causing disruption or damage to other portions of the optic wafer, the imager wafer or the wafer assembly.

While the present invention has been described and illustrated in the context of semiconductor imager device fabrication, it is, of course, not so limited. The use of embodiments of the present invention providing reliefs along streets of mutually secured wafers to provide process margin for singulation thereof is applicable to any situation presenting the same or similar challenges as is described above.

While particular embodiments of the invention have been shown and described, numerous variations and other embodiments will occur to those of ordinary skill in the art. Accordingly, the invention is only limited in terms of the scope of the appended claims.

What is claimed is:

1. A method of dicing an imager wafer assembly, comprising:
    positioning an imager wafer of an imager wafer assembly for engagement by a cutting element;
    aligning at least one street of the imager wafer assembly with the cutting element; and
    cutting the imager wafer with the cutting element along the at least one street and to a depth extending through a portion of the imager wafer and into at least one relief formed in a side of an optic wafer of the imager wafer assembly facing the imager wafer, wherein the method further comprising, after cutting the image wafer along the at least one street, positioning the optic wafer of the image wafer assembly adjacent a cutting element and cutting the optic wafer with the cutting element along the at least one street and to a depth extending into the at least one relief formed in the side of the optic wafer facing the image wafer.

2. The method of claim 1, further comprising affixing the optic wafer to the image wafer with a bond layer along the at least one street prior to cutting the imager wafer along the at least one street.

3. A method of dicing an imager wafer assembly, comprising:
    forming at least one relief in a side of an optic wafer of an imager wafer assembly extending along at least one street of the image wafer assembly;
    disposing a solvent-soluble adhesive filler material in the at least one relief formed in the side of the optic wafer;
    securing an imager wafer to the side of the optic wafer with a portion of the solvent-soluble adhesive filler material disposed in the at least one relief formed in the side of the optic wafer; and
    cutting the imager wafer along the at least one street and to a depth extending through a portion of the imager wafer and into the at least one relief formed in the side of the optic wafer of the imager wafer assembly facing the imager wafer.

4. The method of claim 3, further comprising, after cutting the optic wafer along the at least one street, dissolving the solvent-soluble adhesive filler material.

5. The method of claim 3, further comprising cutting the optic wafer along the at least one street and to a depth extending into the at least one relief formed in the side of the optic wafer facing the imager wafer comprising disposing a portion of the solvent-soluble adhesive filler material on walls of a slot made by cutting the optic wafer along the at least one street during the cutting thereof.

6. The method of claim 3, wherein disposing a solvent-soluble adhesive filler material in the at least one relief formed in the side of the optic wafer comprises selecting the solvent-soluble adhesive filler material to exhibit at least one of an opaque and a non-reflective quality.

7. A method of dicing a wafer assembly, comprising:
    positioning a first side of a wafer assembly for engagement by a cutting element;
    aligning at least one street of the wafer assembly with the cutting element;
    cutting through a first wafer disposed on the first side of the wafer assembly with the cutting element along the at least one street and to a depth extending into at least one relief formed in a side of a second wafer disposed on a second opposing, side of the wafer assembly and facing the first wafer;
    positioning the second side of the wafer assembly for engagement by a cutting element; and
    cutting through the second wafer with the cutting element along the at least one street and to a depth extending into the at least one relief formed in the side of the second wafer facing the first wafer.

8. The method of claim 1, further comprising disposing a filler material within the at least one relief.

9. The method of claim 8, further comprising securing the imager wafer to the side of the optic wafer with the filler material.

10. The method of claim 9, further comprising disposing the filler material along opposing sides of the at least one relief.

11. The method of claim 1, further comprising forming the at least one relief in the side of the optic wafer of the imager wafer assembly to exhibit at least one of a rectangular cross section and a trapezoidal cross section.

12. The method of claim 1, further comprising:
    forming at least one opposing relief on an opposing side of the optic wafer facing away from the imager wafer; and
    aligning the at least one opposing relief with the at least one relief on the side of the optic wafer facing the imager wafer.

13. The method of claim 7, further comprising affixing the optic wafer to the image wafer with a bond layer.

14. The method of claim 13, further comprising disposing a portion of the bond layer within the at least one relief formed in the side of the second wafer.

* * * * *